(12) United States Patent
Cheng et al.

(10) Patent No.: US 8,878,311 B2
(45) Date of Patent: Nov. 4, 2014

(54) INTEGRATED CIRCUIT HAVING RAISED SOURCE DRAINS DEVICES WITH REDUCED SILICIDE CONTACT RESISTANCE AND METHODS TO FABRICATE SAME

(71) Applicant: International Business Machines Corporation, Armonk, NY (US)

(72) Inventors: Kangguo Cheng, Schenectady, NY (US); Bruce B. Doris, Brewster, NY (US); Ali Khakifirooz, Mountain View, NY (US); Pranita Kerber, Slingerlands, NY (US); Christian Lavoie, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 13/852,103

(22) Filed: Mar. 28, 2013

(65) Prior Publication Data
US 2013/0207189 A1    Aug. 15, 2013

Related U.S. Application Data

(63) Continuation of application No. 13/344,806, filed on Jan. 6, 2012, and a continuation of application No. 13/626,242, filed on Sep. 25, 2012, now Pat. No. 8,492,854.

(51) Int. Cl.
*H01L 29/78*     (2006.01)
*H01L 21/8238*   (2006.01)
(Continued)

(52) U.S. Cl.
CPC ........ *H01L 29/78* (2013.01); *H01L 21/823807* (2013.01); *H01L 21/28518* (2013.01); *H01L 27/1052* (2013.01); *H01L 29/41766* (2013.01); *H01L 29/41783* (2013.01); *H01L 29/7848* (2013.01); *H01L 29/7845* (2013.01); *H01L 21/823814* (2013.01); *H01L 29/66545* (2013.01); *H01L 23/485* (2013.01); *H01L 27/1203* (2013.01); *H01L 29/6653* (2013.01); *H01L 21/76805* (2013.01); *H01L 21/84* (2013.01); *H01L 29/665* (2013.01)
USPC ............ 257/412; 257/377; 257/384; 257/755

(58) Field of Classification Search
CPC ...................... H01L 27/1203; H01L 21/28061
USPC .................................. 257/412, 377, 384, 755
See application file for complete search history.

(56) References Cited

U.S. PATENT DOCUMENTS 5,866,459 A  *  2/1999  Naem et al. ................... 438/300
6,531,347 B1    3/2003  Huster et al.
(Continued)

OTHER PUBLICATIONS

Khakifirooz et al., "Challenges and Opportunities of Extremely Thin SOI (ETSOI) Cmos Technology for Future Low Power and General Purpose System-on-Chip Applications", IEEE 2010.

(Continued)

*Primary Examiner* — Jack Chen
(74) *Attorney, Agent, or Firm* — Harrington & Smith

(57) ABSTRACT

A structure has at least one field effect transistor having a gate stack disposed between raised source drain structures that are adjacent to the gate stack. The gate stack and raised source drain structures are disposed on a surface of a semiconductor material. The structure further includes a layer of field dielectric overlying the gate stack and raised source drain structures and first contact metal and second contact metal extending through the layer of field dielectric. The first contact metal terminates in a first trench formed through a top surface of a first raised source drain structure, and the second contact metal terminates in a second trench formed through a top surface of a second raised source drain structure. Each trench has silicide formed on sidewalls and a bottom surface of at least a portion of the trench. Methods to fabricate the structure are also disclosed.

7 Claims, 14 Drawing Sheets

(51) Int. Cl.
*H01L 21/285* (2006.01)
*H01L 29/417* (2006.01)
*H01L 23/485* (2006.01)
*H01L 27/12* (2006.01)
*H01L 21/768* (2006.01)
*H01L 21/84* (2006.01)
*H01L 27/105* (2006.01)
*H01L 29/66* (2006.01)

(56) References Cited

U.S. PATENT DOCUMENTS

| | | |
|---|---|---|
| 6,774,000 B2 | 8/2004 | Natzle et al. |
| 7,037,795 B1 | 5/2006 | Barr et al. |
| 7,115,955 B2 | 10/2006 | Messenger et al. |
| 7,153,737 B2 | 12/2006 | Kwon et al. |
| 7,186,642 B2 | 3/2007 | Yin et al. |
| 7,479,437 B2 | 1/2009 | Greene et al. |
| 7,488,660 B2 | 2/2009 | Dyer et al. |
| 7,652,332 B2 | 1/2010 | Cartier et al. |
| 2008/0023772 A1 | 1/2008 | Kawakita |

OTHER PUBLICATIONS

Kavalieros et al., "TRI-Gate Transistor Architecture with High-k Gate Dielectrics, Metal Gates and Strain Engineering", 2006 Symposium on VLSI Technology Digest of Technical Papers, IEEE.

Tan et al., "Strained p-Channel FinFETs with Extended Π-Shaped Silicon-Germanium Source and Drain Stressors", IEEE Electron Device Letters, vol. 28, No. 10, Oct. 2007.

Ke et al., "Recessed Source/Drain for Sub-50 nm UTS SOI MOSFET", Semiconductor Science and Technology, 2007 IOP Publishing Ltd., Semicond. Sci. Technol. 22 (2007) 577-583.

Eneman et al., "Scalability of Stress Induced by Contact-Etch-Stop Layers: A simulation Study", IEEE Transactions on Electron Devices, vol. 54, No. 6 Jun. 2007.

Cheng et al., "Extremely Thin SOI (ETSOI) CMOS with Record Low Variability for Lower Power System-On-Chip Applications", Solid-State Circuits Conference Digest of Technical Papers (ISSCC), 2010 IEEE International Issue Date: Feb. 7-11, 2010, pp. 152-153.

Uchino et al., "A Raised Source/Drain Technology Using In-Situ P-Doped SiGe and B-doped Si for 0.1-um CMOS ULSIs", Electron Device Meeting 1997, IEDM '97 Technical Digest, International, Dec. 7-10, 1997, pp. 479-482.

\* cited by examiner

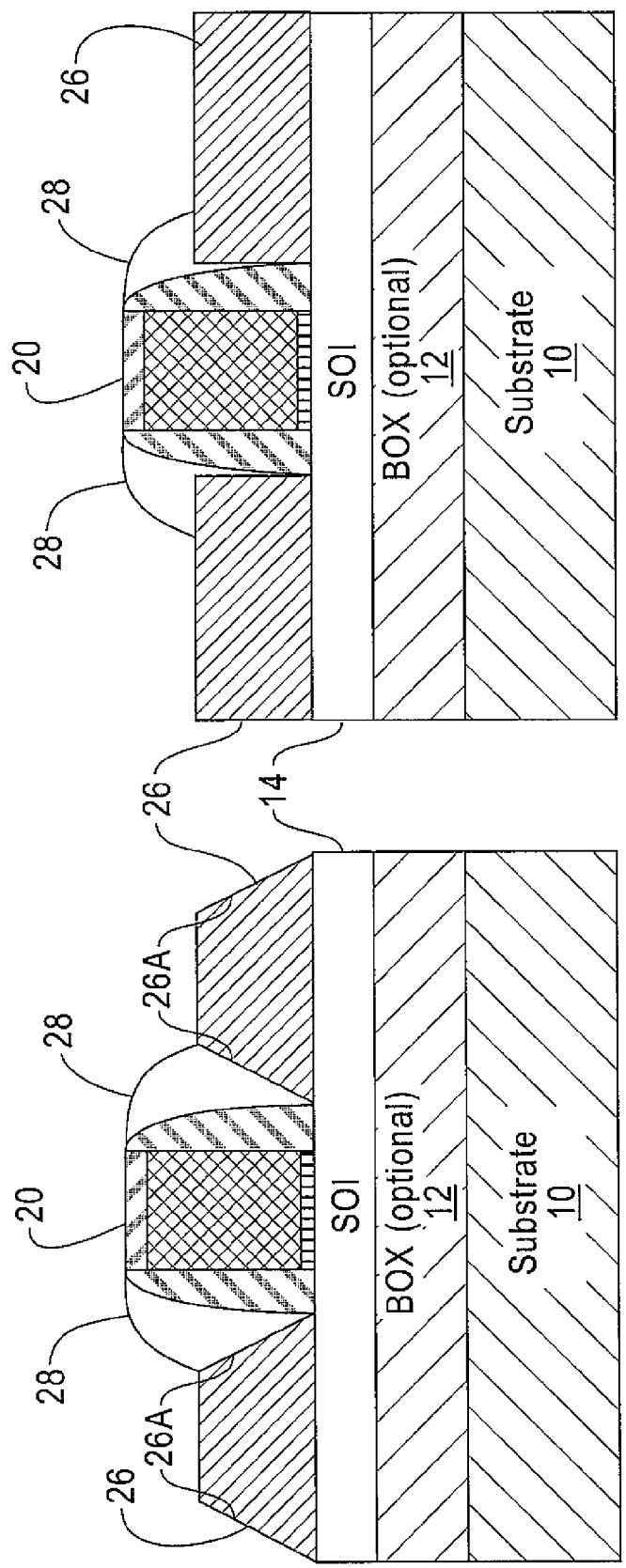
FIG. 5A Faceted RSD
FIG. 5B Unfaceted RSD

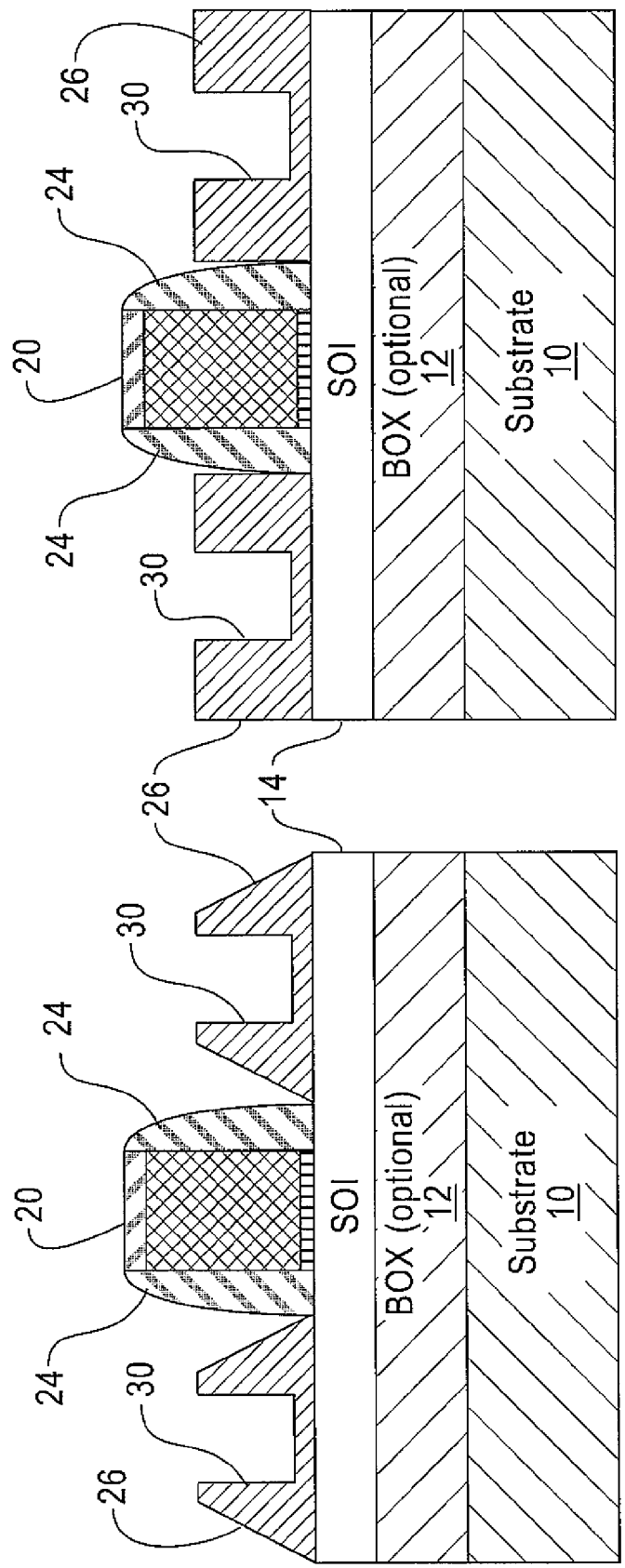

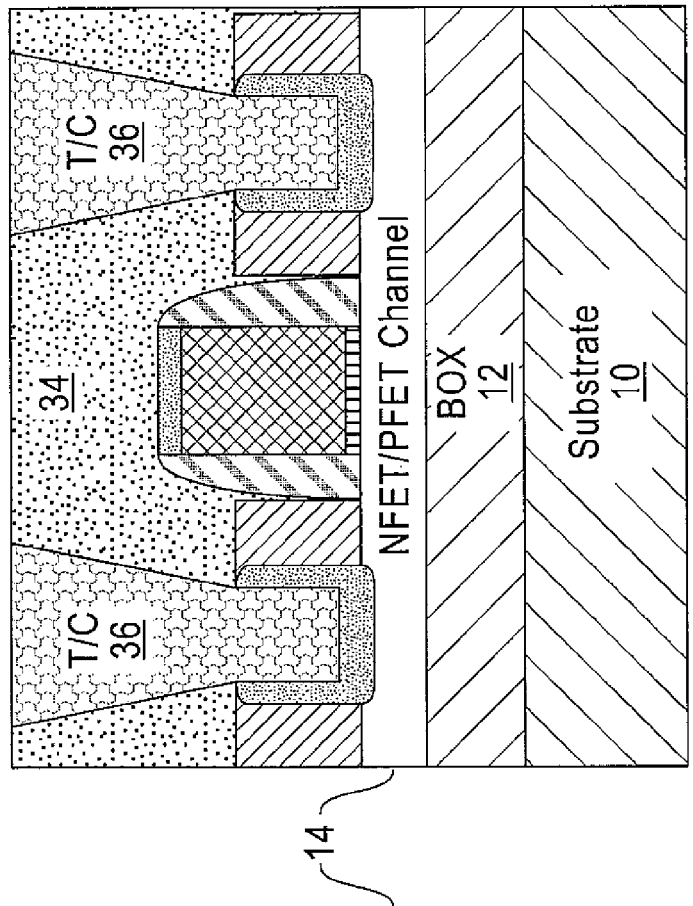
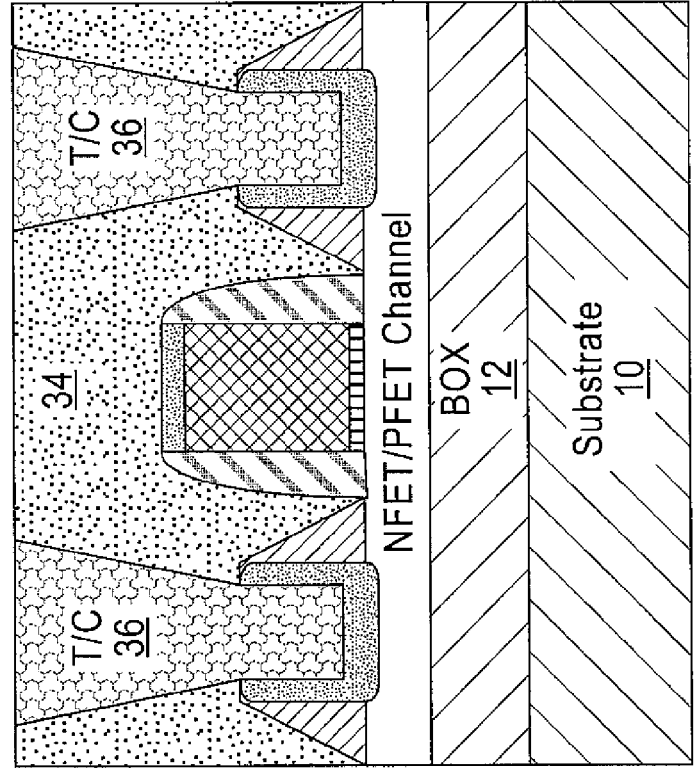
FIG. 9A
FIG. 9B

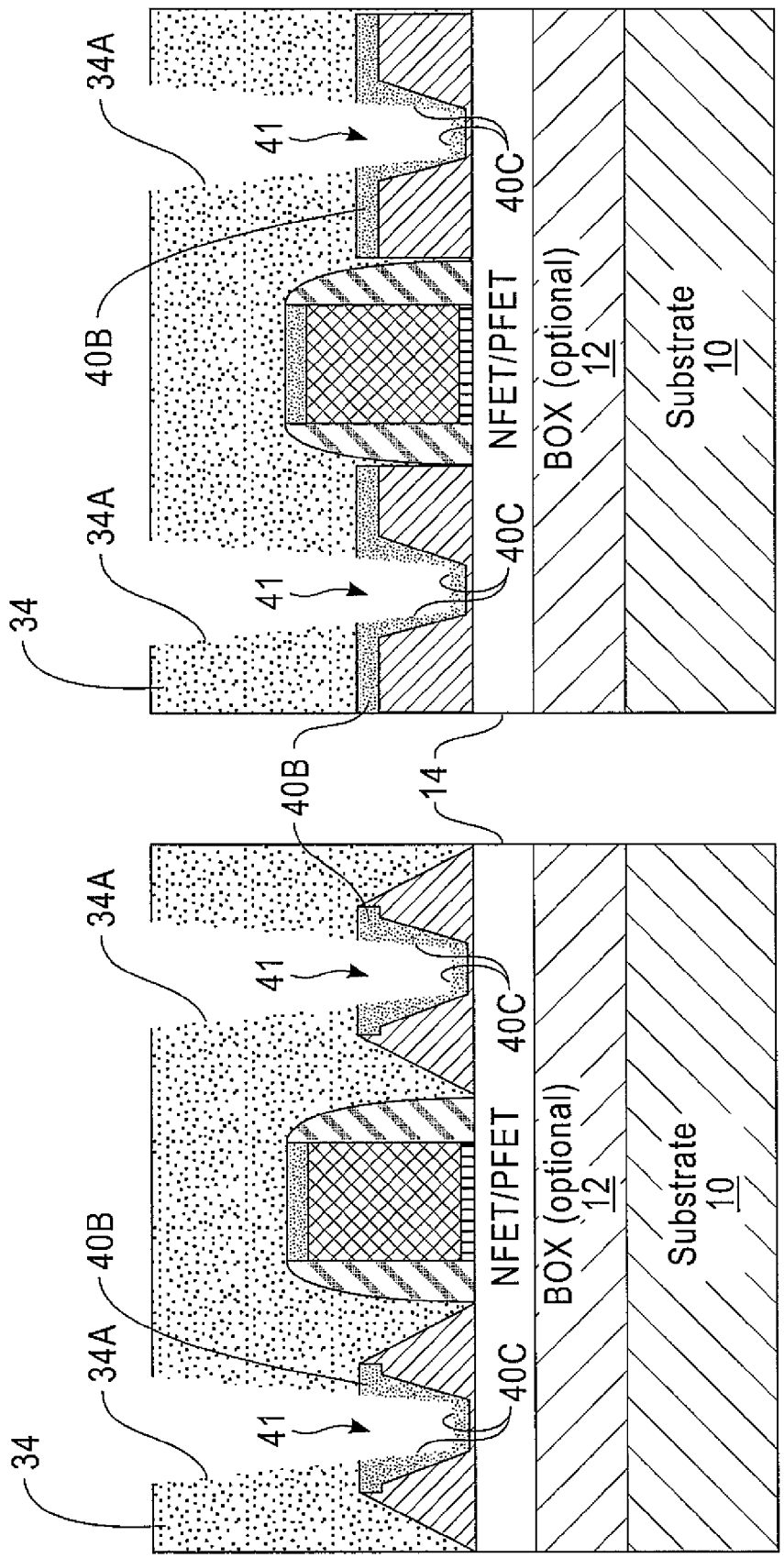

INTEGRATED CIRCUIT HAVING RAISED SOURCE DRAINS DEVICES WITH REDUCED SILICIDE CONTACT RESISTANCE AND METHODS TO FABRICATE SAME

CROSS-REFERENCE TO RELATED PATENT APPLICATIONS

This patent application is a continuation patent application of copending U.S. patent application Ser. No. 13/626,242, filed Sep. 25, 2012, which in turn is a continuation patent application of copending U.S. patent application Ser. No. 13/344,806, filed Jan. 6, 2012, the disclosures of which are incorporated by reference herein in their entireties.

TECHNICAL FIELD

The exemplary embodiments of this invention relate generally to semiconductor devices and fabrication techniques and, more specifically, relate to the fabrication of semiconductor transistor devices, such as those used in random access memory (RAM) and logic circuitry, using a silicon on insulator (SOI) substrate such as an extremely thin SOI (ETSOI) substrate, also known as a fully depleted SOI, or a partially depleted SOI (PDSOI).

BACKGROUND

In SOI technology a thin silicon layer is formed over an insulating layer, such as silicon oxide, which in turn is formed over a substrate. This insulating layer is often referred to as a buried oxide (BOX) layer or simply as a BOX.

In current CMOS technology silicide contact resistance can be a significant performance limiting factor. With continued device pitch scaling the contact length of the CMOS transistors is reduced significantly thereby adversely impacting the contact resistance.

SUMMARY

In an aspect thereof the exemplary embodiments of this invention provide a structure that comprises at least one field effect transistor having a gate stack disposed between raised source drain structures that are adjacent to the gate stack. In this embodiment the gate stack and raised source drain structures are disposed on a surface of a semiconductor material, where the surface of the semiconductor material is a surface of a silicon-on-insulator layer disposed over a layer of buried oxide. The structure further comprises a layer of field dielectric overlying the gate stack and raised source drain structures, and also first contact metal and second contact metal extending through the layer of field dielectric. The first contact metal terminates in a first trench formed through a top surface of a first raised source drain structure, and the second contact metal terminates in a second trench formed through a top surface of a second raised source drain structure. Each trench comprises silicide formed on sidewalls and a bottom surface of at least a portion of the trench. In this structure the bottom surface of each trench extends at least to the layer of buried oxide.

In another aspect thereof the exemplary embodiments of this invention provide a structure that comprises at least one field effect transistor having a gate stack disposed between raised source drain structures. The gate stack and raised source drain structures are disposed on a surface of a semiconductor material. Each raised source drain structure has a width and a height from the surface of the semiconductor material. The structure further comprises first contact metal terminating in a first trench formed through a top surface of a first raised source drain structure along substantially an entire width of the first raised source drain structure and extending into the first raised source drain structure by a distance substantially equal to the height of the first raised source drain structure and the first contact metal forming a bar-shaped contact to the first raised source drain structure. The structure further comprises second contact metal terminating in a second trench formed through a top surface of a second raised source drain structure along substantially an entire width of the second raised source drain structure and extending into the second raised source drain structure by a distance substantially equal to the height of the second raised source drain structure. The second contact metal forms a bar-shaped contact to the second raised source drain structure. In this structure each of the first trench and the second trench comprises silicide formed on sidewalls and a bottom surface of at least a portion of the trench.

In a still further aspect thereof the exemplary embodiments of this invention provide a structure that comprises at least one field effect transistor having a gate stack disposed between raised source drain structures. The gate stack is disposed over a channel region. The gate stack and raised source drain structures are disposed on a surface of a semiconductor material. Each raised source drain structure has a width and a height from the surface of the semiconductor material. The first contact metal terminates in a first trench formed through a top surface of a first raised source drain structure along a portion of a width of the first raised source drain structure and that extends into the first raised source drain structure. The first contact metal forms a contact stud to the first raised source drain structure. The structure further comprises second contact metal terminating in a second trench formed through a top surface of a second raised source drain structure along a portion of a width of the second raised source drain structure and extending into the second raised source drain structure. The second contact metal forms a contact stud to the second raised source drain structure. The structure further includes a layer of field dielectric material disposed over at least the first trench and the second trench and that fills those portions of the first trench not occupied by the first contact metal and those portions of the second trench not occupied by the second contact metal. The layer of field dielectric is selected to impart one of a tensile stress or compressive stress to the channel region.

BRIEF DESCRIPTION OF THE SEVERAL VIEWS OF THE DRAWINGS

FIGS. 1-15 illustrate a SOI embodiment, such as an ETSOI embodiment or a PDSOI embodiment of this invention, where.

FIG. 1 is an enlarged cross-sectional view of a portion of an SOI starting structure that includes a substrate, a buried oxide or BOX layer and a SOI (Si) layer overlying the BOX;

FIG. 2 shows the structure of FIG. 1 after a blanket deposition of a gate dielectric (oxide) layer, a metal-gate layer and a protective hard mask to form a gate stack precursor;

FIG. 3 shows the structure of FIG. 2 after photolithographic patterning of the layers and the formation of a gate structure;

FIG. 4 shows the structure of FIG. 3 after definition of a gate spacer;

FIGS. 5A and 5B, collectively referred to as FIG. 5, show the structure of FIG. 4 after the formation of raised source-drains (RSD) and a second spacer, where FIG. 5A shows a faceted RSD and FIG. 5B shows an un-faceted RSD;

FIGS. 6A and 6B, collectively referred to as FIG. 6, show the structure of FIG. 5 after etching the RSDs to form trenches;

FIGS. 9A and 9B, collectively referred to as FIG. 9, show the structure of FIG. 8 after the deposition of a metal via having intrinsic stress, either tensile (T) or compressive (C), in the trench so as to contact the silicide exposed through the apertures in accordance with a first embodiment.

FIGS. 10-13 are applicable to the second embodiment of this invention, where.

FIGS. 12A and 12B, collectively referred to as FIG. 12, show the structure of FIG. 11 after a second silicide process wherein the metal is deposited through the apertures opened in FIG. 11 to contact at least the portions of the RSD Si exposed in the trenches followed by siliciding the deposited metal.

DETAILED DESCRIPTION

Figure 16:
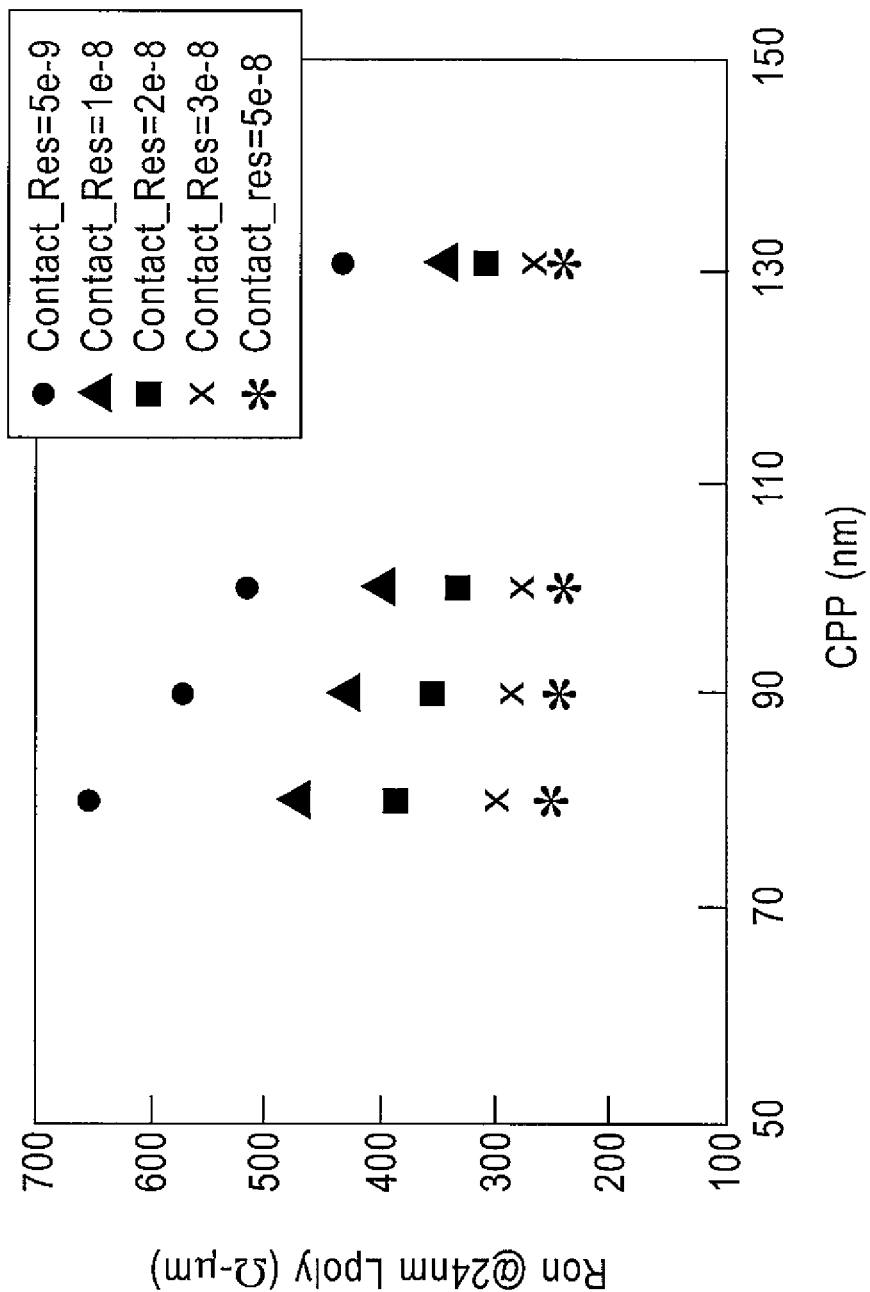
FIG. 16 illustrates an increase in total access resistance (Ron) for a device having a gate length (Lgate) of 24 nm for different device pitch (CPP) and contact resistance assumptions.

FIG. 16 illustrates the increase in the total access resistance (Ron) for a device having a gate length (Lgate) of 24 nm for different device pitch (CPP) and contact resistance assumptions. It can be noted that Ron changes by 500 ohm-μm when Rho_C changes by an order of magnitude at 80 CPP, and that Ron changes by 250 ohm-μm when Rho_C changes by an order of magnitude at 130 CPP.

One possible approach to reducing the access resistance noted above is to reduce the metal-silicon contact resistivity by employing different metals and/or co-implants at the silicon-contact interface in order to reduce the Schottky barrier height. However, the use of reduced annealing temperatures during or after the silicide process can preclude several metal and/or co-implant options for barrier height reduction. Additionally, different metals and/or co-implants and annealing temperatures may be required for NFET devices and PFET devices, rendering this approach generally unsuitable for CMOS processing.

The exemplary embodiments of this invention provide a process to increase the silicide surface area which in turn reduces the access resistance for transistors. Moreover this technique can be applied to devices having both type of polarity, i.e., the process can be used without modification for both PFETS and for NFETS.

The embodiments of this invention provide a method and structure to increase the silicide contact surface area without increasing the device pitch for raised source drain (RSD) planar devices. For example, the RSD can be recessed by about 20 nm to obtain at least a two times increase in the contact length which results in a substantial reduction in contact resistance. The process can be implemented in a self-aligned fashion and does not require an alteration of the typical thermal processing cycles.

The embodiments of this invention are described in the context of SOI substrates including ETSOI and PDSOI substrates. However, the teachings of this invention can also be applied to CMOS devices fabricated on a bulk substrate.

FIGS. 1-15 illustrate a SOI embodiment, such as an ETSOI embodiment or a PDSOI embodiment of this invention.

Figure 1:
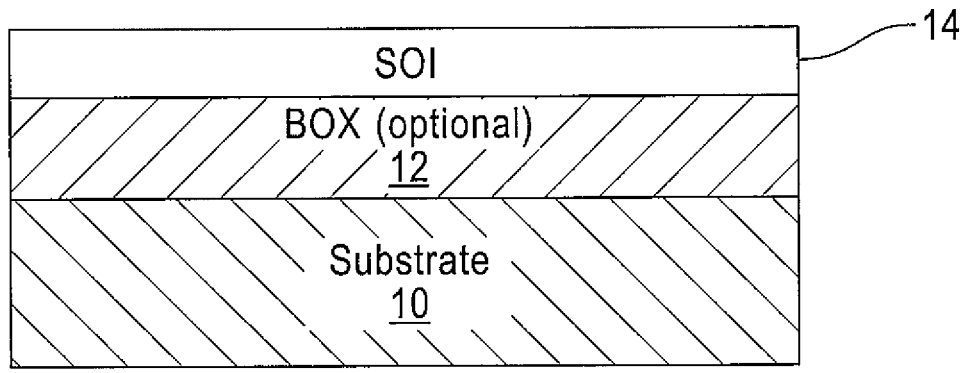

FIG. 1 is an enlarged cross-sectional view of a portion of an SOI starting structure that includes a substrate 10, an overlying insulting layer (a buried oxide or BOX layer 12) and a SOI (Si) layer 14 overlying the BOX 12. In FIG. 1, and the other FIGURES, the layer thicknesses and feature/structure sizes are not drawn to scale. The SOI layer 14 in this embodiment can be an ETSOI layer and can have a thickness in a range of, for example about 3 nm to about 15 nm. The SOI layer 14 in this embodiment can instead be a PDSOI layer and can have a thickness in a range of, for example about 80 nm to about 130 nm. The BOX 12 can have a thickness in a range of, by example, about 10 nm to about 200 nm (or thicker). The substrate 10 can be Si and can have any desired thickness.

Note that the BOX 12 can be considered as optional, such as when it is desired to fabricate the transistor devices using a bulk Si substrate. In this case the SOI layer 14 can be considered as an upper portion of the Si substrate 10. The remainder of this description will focus on the SOI structures, however it should be kept in mind that the embodiments of this invention are not limited for use with only SOI substrates.

Figure 2:
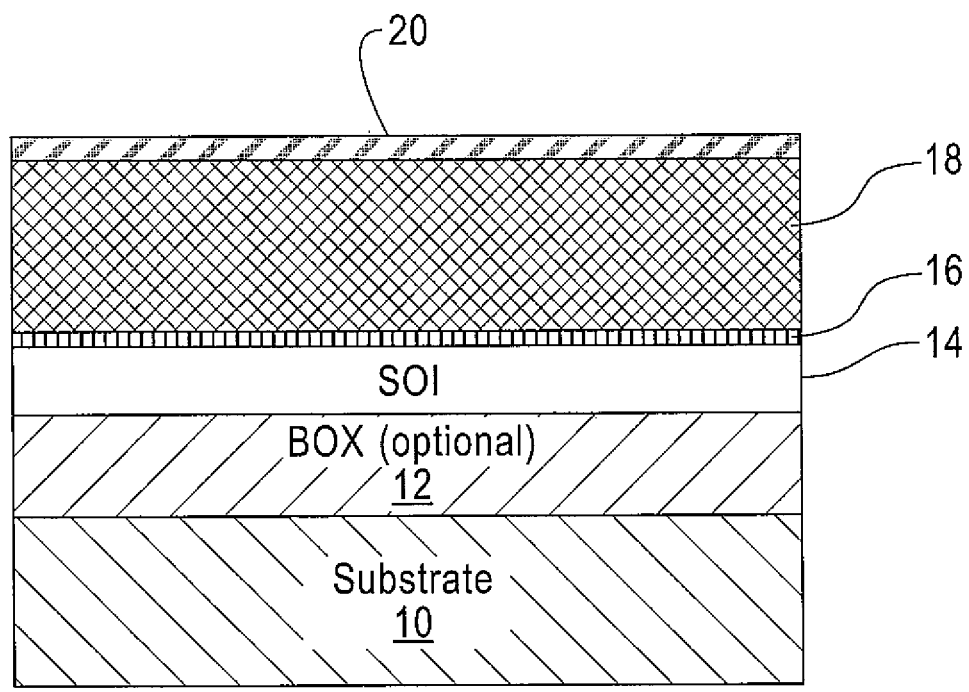

FIG. 2 shows the structure of FIG. 1 after a blanket deposition of a gate dielectric (oxide) layer 16, a metal-gate layer 18 and a protective dielectric layer 20 (hard mask). These three deposited layers can be considered as a gate stack precursor.

The gate dielectric layer 16 can have an exemplary thickness in a range of about 2 nm to about 5 nm. In some embodiments the gate dielectric layer 16 can be or include a layer of high dielectric constant (high-k) material comprising a dielectric metal oxide and having a dielectric constant that is greater than the dielectric constant of silicon nitride of 7.5. The high-k dielectric layer 16 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 16 may be from 1 nm to 10 nm, and more preferably from about 1.5 nm to about 3 nm. The high-k dielectric layer 16 can have an effective oxide thickness (EOT) on the order of, or less than, about 1 nm.

The metal-gate layer 18 can have an exemplary thickness in a range of about 5 nm to about 50 nm and can be formed of any desired gate metal or gate metal system. The metal-gate layer 18 can be deposited using, for example, one of chemical vapor deposition (CVD), physical vapor deposition (PVD), or atomic layer deposition (ALD). As non-limiting examples the gate metal 18 can include a metal system selected from one or more of TiN, TiC, TaN, TaC, TaSiN, HfN, W, Al and Ru, and can be selected at least in part based on the desired work function (WF) of the device (NFET or PFET) to be fabricated. In other embodiments the gate conductor can be formed from a layer of heavily doped polysilicon(poly).

The dielectric layer 20 is one that is resistant to a subsequently performed RSD etching process, and could be composed of, for example, an oxide, a nitride, aluminum oxide, etc.). The dielectric (hard mask) layer 20 can be formed by any suitable deposition process and can have a thickness of about 15 nm to about 25 nm (as one non-limiting thickness range). The dielectric layer 20 is a sacrificial layer and is subsequently removed and replaced with a desired gate contact metal in FIG. 7.

Figure 3:
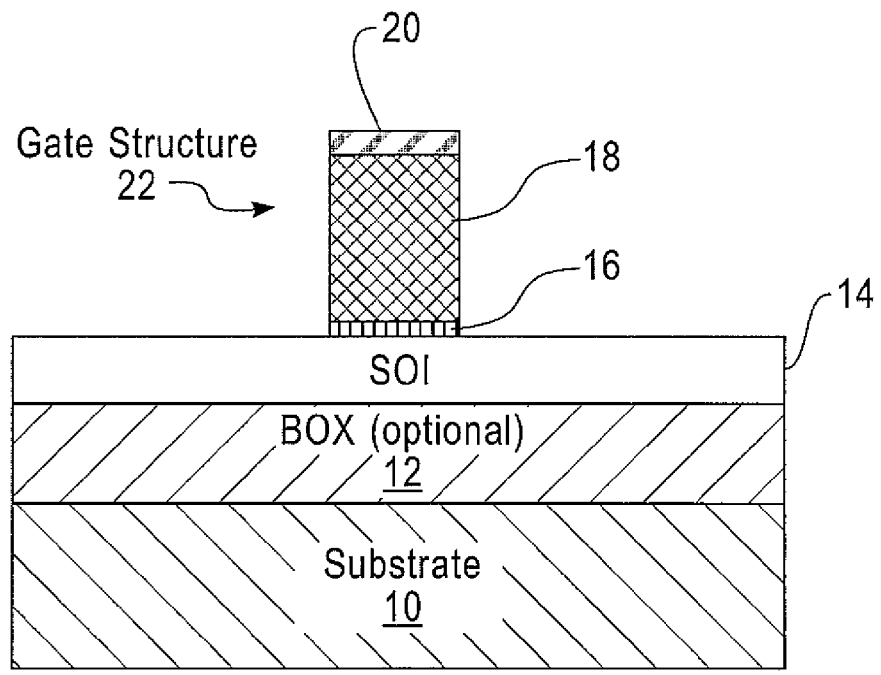

FIG. 3 shows the structure of FIG. 2 after photolithographic patterning of the layers 16, 18 and 20 and the formation of a gate structure 22. A reactive ion etch (RIB) or any desired single or multi-step etching process can be used to remove the layers 16, 18 and 20 except where the gate structure 22 is desired to be located. In practice some large number of gate structures are simultaneously patterned and defined.

Figure 4:
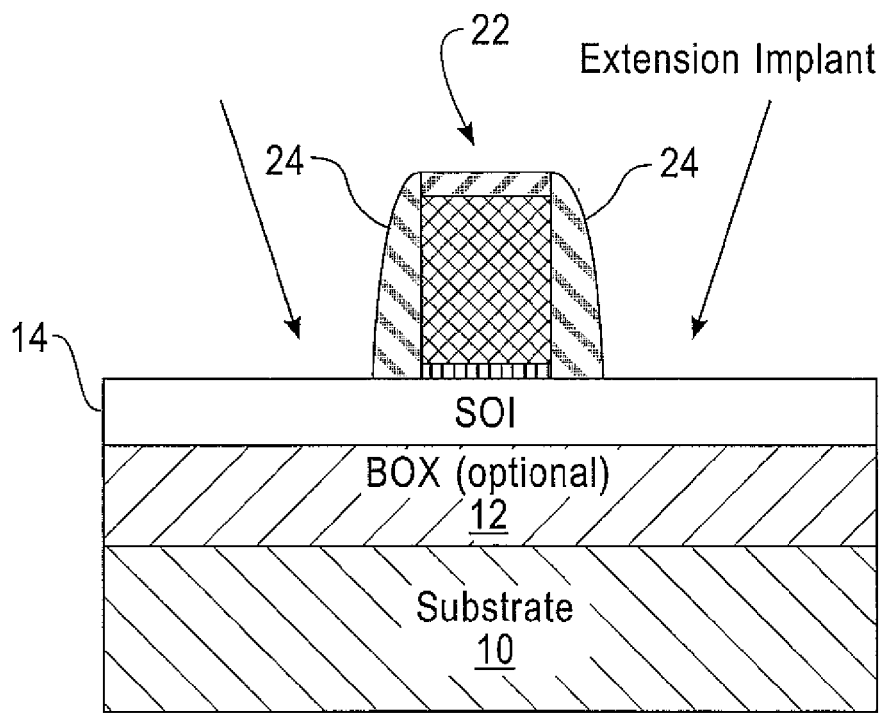

FIG. 4 shows the structure of FIG. 3 after deposition of gate spacer material (e.g., nitride or oxide) and a RIE process to define the gate spacer 24. An optional extension implant into the SOI layer 14 can be performed to implant source-drain (S/D) extension regions adjacent to the gate structures 22. The implant species is dependent on whether the transistor being fabricated is a PFET or an NFET as is well known.

FIGS. 5A and 5B, collectively referred to as FIG. 5, show the structure of FIG. 4 after the formation of raised source-drains (RSD) 26 and the deposition of a nitride (e.g., $SiN_3$) and/or an oxide (e.g., $SiO_2$) and a RIE to form a second spacer 28. The second spacer 28 is formed to protect the RSD edge adjacent the gate structure 22 and enables the formation of a self-aligned RSD trench (in FIG. 6).

The RSD 26 can be implanted with a desired dopant or it can be in-situ doped when deposited. The RSD can be faceted (as shown in FIG. 5A) or not faceted (as shown in FIG. 5B). Henceforth for FIGS. 6-10 a FIGURE number followed by "A" refers to the faceted RSD embodiment, while a FIGURE number followed by "B" refers to the unfaceted RSD embodiment.

As an example, the RSD 26 can be in-situ doped and can have a dopant concentration in a range of, as a non-limiting example, about $5 \times 10^{19}$ atoms/$cm^3$ to about $8 \times 10^{21}$ atoms/$cm^3$. The RSD 26 are formed by the epitaxial growth of silicon, such as by the use of a mixture of silane and dichlorosilane gases with a chemical vapor deposition (CVD) process. Phosphorus is one suitable n-type dopant, and Boron is one suitable p-type dopant. The epitaxial growth can be preferential to Si and can result, possibly in combination with an etching step performed during a cyclical epitaxial growth process, in a layer that exhibits the facets 26A shown in FIG. 5A.

The formation of in-situ doped RSD structures is well characterized in the art. For example, reference can be made to commonly owned U.S. Pat. No. 6,774,000, "Method of Manufacture of MOSFET Device with In-Situ Doped Raised Source and Drain Structures", Wesley C. Natzle et al., and to "A raised source/drain technology using in-situ P-doped SiGe and B-doped Si for 0.1-µm CMOS ULSIs", Takashi Uchino et al., Electron Devices meeting, 1997, IEDM '97. Technical Digest, International, 7-10 Dec. 1997, pgs. 479-482. Reference can also be made to "Extremely Thin SOI (ETSOI) CMOS with Record Low Variability for Low Power System-on-Chip Applications", K. Cheng, A. Khakifirooz, P. Kulkarni, S. Ponoth, J. Kuss, D. Shahrjerdi, L. F. Edge, A. Kimball, S. Kanakasabapathy, K. Xiu, S. Schmitz, A. Reznicek, T. Adam, H. He, N. Loubet, S. Holmes, S. Mehta, D. Yang, A. Upham, S.-C. Seo, J. L. Herman, R. Johnson, Y. Zhu, P. Jamison, B. S. Haran, Z. Zhu, L. H. Vanamurth, S. Fan, D. Horak, H. Bu, P. J. Oldiges, D. K. Sadana, P. Kozlowski, D. McHerron, J. O'Neill, B. Doris, Solid-State Circuits Conference Digest of Technical Papers (ISSCC), 2010 IEEE International Issue Date: 7-11 Feb. 2010 pgs. 152-153.

FIGS. 6A and 6B, collectively referred to as FIG. 6, show the structure of FIG. 5 after etching the Si of the RSD 26 to form trenches 30. The etch is preferably an anisotropic etch selective to the Si of the RSD structures 26 and can be accomplished using a RIE. The second spacer 28 is subsequently removed. The trench depth is selected based on the height of the RSD 26 so as to extend substantially through the thickness of the RSD.

It is pointed out that the Si etch in the RSD 26 can be limited to the contact area only or, in another embodiment, the etch could run the entire width (or almost the entire width) of the device. In this latter case the contact would be a bar instead of a stud and would fill the trench in the RSD 26 throughout the device width.

Figure 7B:
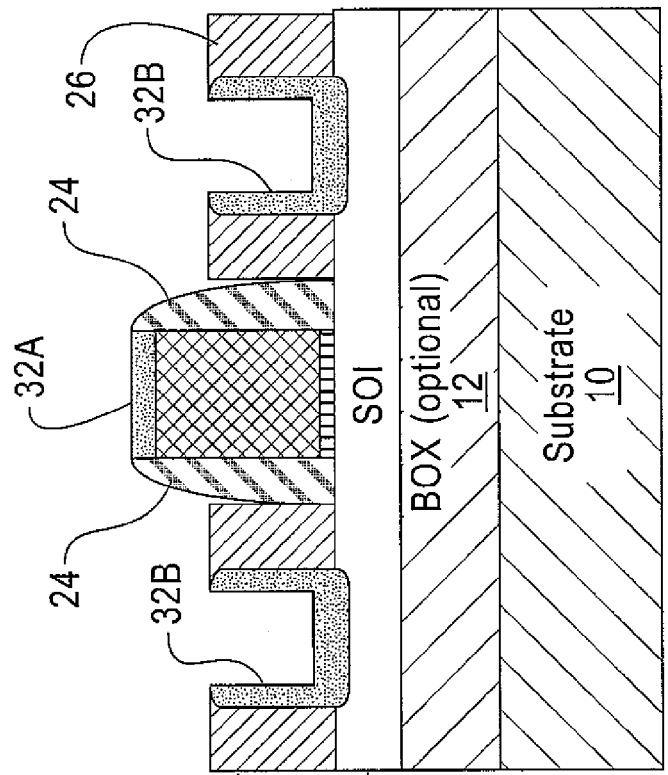
FIGS. 7A and 7B, collectively referred to as FIG. 7, show the structure of FIG. 6 after stripping the hard mask and siliciding deposited metal on the top of a gate conductor 18 and within the trenches.
Figure 7A:
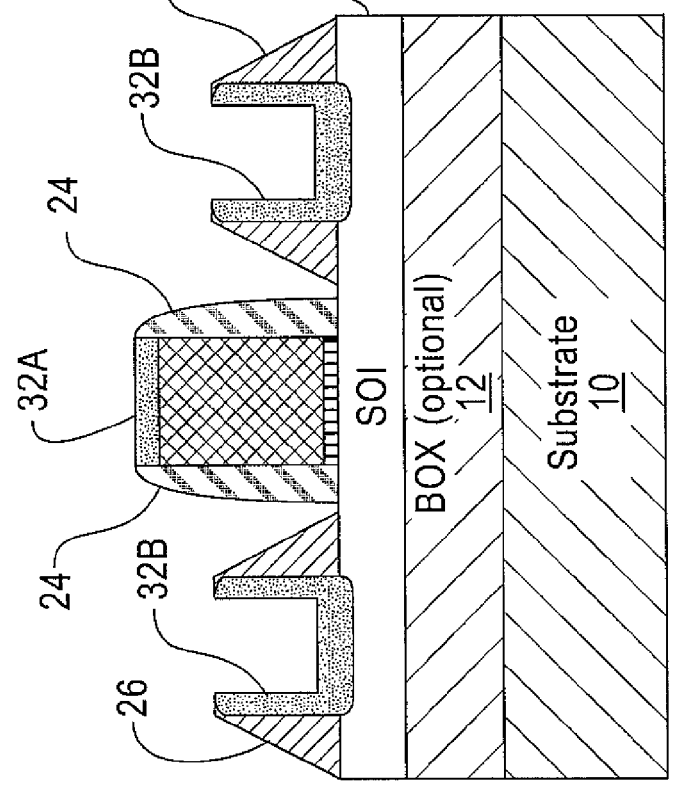

FIGS. 7A and 7B, collectively referred to as FIG. 7, show the structure of FIG. 6 after stripping the protective dielectric layer 20, application of a mask followed by the deposition of a metal selectively onto the top of the gate conductor 18 and into the trenches 30, and an anneal performed at low temperature (for example, less than about 450° C.) to form silicide 32, including gate contact silicide 32A and RSD contact silicide 32B. Exemplary and non-limiting metals that can be deposited include Nickel, Platinum or Titanium, and the metal thickness is preferably several Å, such a about 6 Å to about 8 Å. The anneal process thus produces one of NiSi, PtSi or TiSi. The RSD contact silicide 32B may or may not extend through the SOI layer 14 to the upper surface of the BOX 12.

Figure 8B:
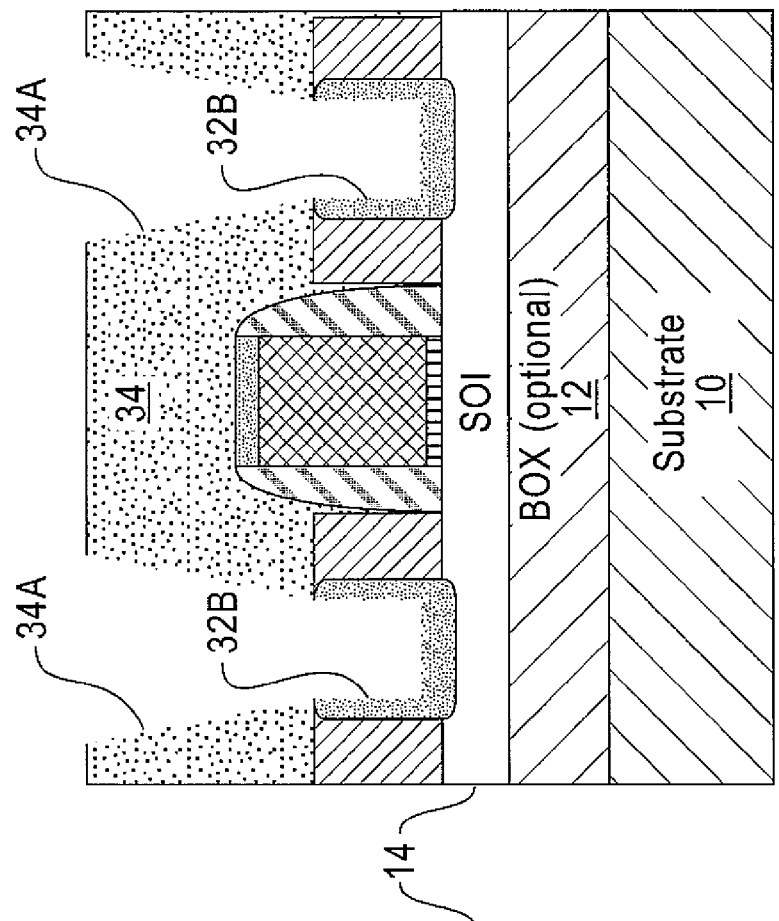
FIGS. 8A and 8B, collectively referred to as FIG. 8, show the structure of FIG. 7 after a blanket deposition of a field dielectric layer and an etch is performed to open apertures through the field dielectric layer over the RSD.
Figure 8A:
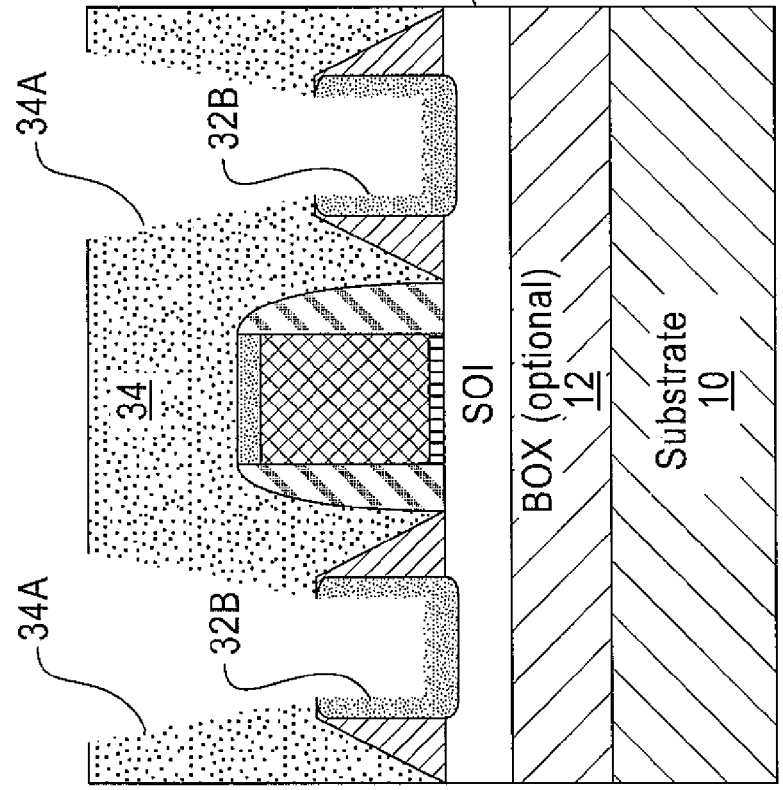

FIGS. 8A and 8B, collectively referred to as FIG. 8, show the structure of FIG. 7 after a blanket deposition of a field dielectric layer 34 (an oxide or a nitride). The field dielectric layer 34 can have a thickness, for example, in a range of about 50 nm to about 150 nm. A contact area (CA) mask is applied and an etch is performed to open apertures 34A through the field dielectric layer 34 over the RSD 26. The apertures 34A stop on the RSD contact silicide 32B. It can be noted that FIG. 8 (and the other Figures) show the cross-section at the contact studs (vias), and that elsewhere along the length of the RSD 26 the field dielectric 34 fills the RSD trench 32B. Note again that the contact could have the form of a bar that runs the width of the device and in this case the apertures 34A are shaped accordingly.

At this point subsequent processing can be performed in accordance with one of several embodiments, as detailed below.

Embodiment 1

FIGS. 9A and 9B, collectively referred to as FIG. 9, show the structure of FIG. 8 after the deposition of a metal via 36 having intrinsic stress, either tensile (T) or compressive (C), in the trench 30 so as to contact the silicide 32B exposed through the apertures 34A of FIG. 8. The result is the formation of either an NFET or a PFET having a channel in the SOI 14 between the RSD structures 26. The type of the intrinsic stress (TIC) is selected to have a polarity that enhances the channel strain, thereby enhancing the carrier mobility in the channel. Suitable contact metals to form the vias 36 include, for example, Tungsten, Copper or Aluminum. As is well known in the art the type of stress that the contact metal exhibits is a function of how the metal is deposited.

According to some exemplary embodiments of the present invention the metal vias 36 can be stress engineered whereby they are formed to be in an intrinsic state of stress to provide a compressive state of stress or a tensile state of stress that is propagated to the channel. For example, metal via 36 can have a Pillings-Bedworth (PB) ratio that allows for a net volumetric expansion upon anneal to impose a compressive stress, or optionally can have PB ratio that allows for a net volumetric compression upon anneal to impose a tensile stress. Both techniques may be incorporated into multiple devices on the same wafer. Techniques for stress engineering metals are well known. For example, reference can be made to: Koch, R. J., The Intrinsic Stress of Polycrystalline and Epitaxial Thin Metal Films, Phys.: Condens. Matter 6, 9519-9550 (1994); Hoffman, D. W., Thornton, J A., The Compressive Stress Transition in Al, V, Zr, Nb and W Metal Films Sputtered at Low Working Pressures, Thin Solid Films, 45, 387-396 (1977), and Hoffman, D. W., Stress and Property Control in Sputtered Metal Films Without Substrate Bias, Thin Solid Films, 107, 353-358 (1983).

As can be clearly seen in FIG. 9 the use of the silicided RSD trench provides a significantly greater metal via contact area, as compared to a conventional case where the metal via 36 would contact just a silicided pad atop the RSD (e.g., see FIG. 10), thereby significantly reducing contact area resistance.

Embodiment 2

FIGS. 10-13 are applicable to the second embodiment of this invention.

Figure 10B:
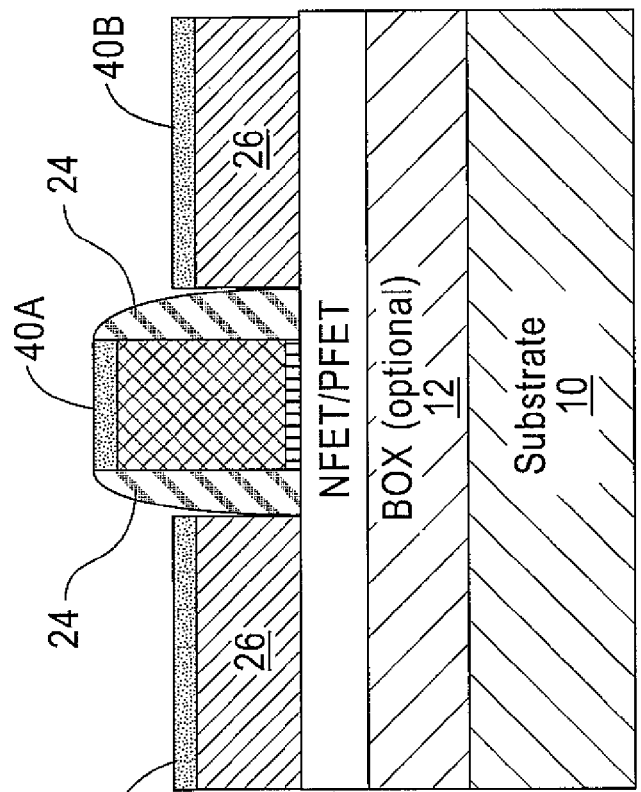
FIGS. 10A and 10B, collectively referred to as FIG. 10, show a structure that has undergone conventional CMOS process flow up until the deposition of contact area metal on the RSD and on the gate structure, followed by an anneal to silicide the deposited contact metal forming a silicided gate contact and silicided RSD contacts.
Figure 10A:
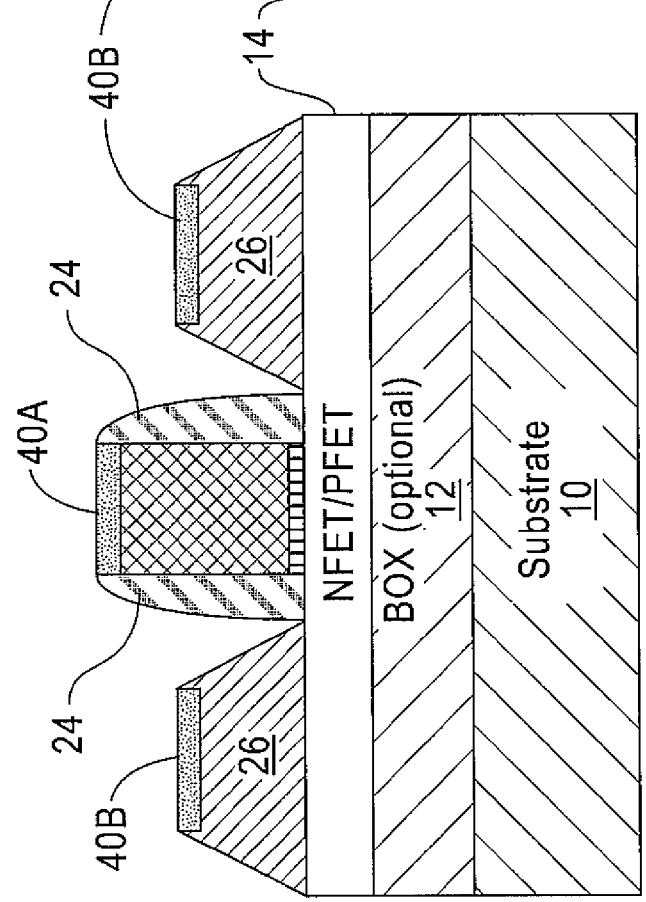

FIGS. 10A and 10B, collectively referred to as FIG. 10, show a structure that has undergone conventional CMOS process flow up until the deposition of contact area metal on the RSD and on the gate structure 22, followed by an anneal to silicide the deposited contact metal. This forms silicided gate contact 40A and silicided RSD contacts 40B. As in the embodiments of FIGS. 1-9, FIG. 10A shows the faceted RSD 26 and FIG. 10B the non-faceted RSD 26.

Figures 11A, 11B:
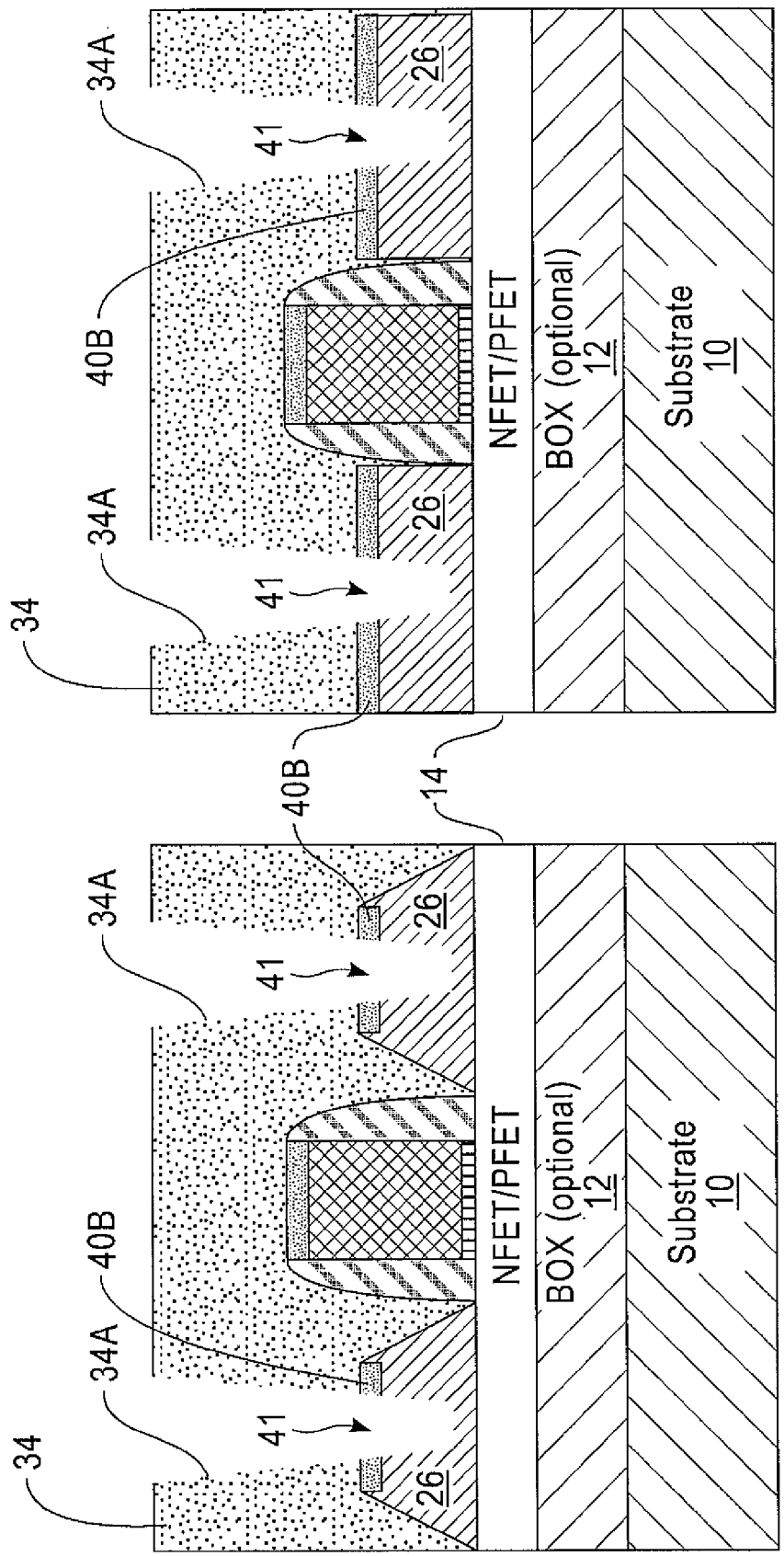
FIGS. 11A and 11B, collectively referred to as FIG. 11, show the structure of FIG. 10 after blanket deposition of the field dielectric layer and an etch to open apertures through the field dielectric layer over the RSD and the opening of opens trenches at least into the RSD structures.

FIGS. 11A and 11B, collectively referred to as FIG. 11, show the structure of FIG. 10 after blanket deposition of the field dielectric layer 34 (an oxide or a nitride). As in FIG. 8 the field dielectric layer 34 can have a thickness, for example, in a range of about 50 nm to about 150 nm. The contact area (CA) mask is applied and an etch is performed to open apertures 34A through the field dielectric layer 34 over the RSD 26. In this case the etch can include multiple etch processes to etch the field oxide 34, then etch at least a portion of the area of the silicided RSD contacts 40B, and then etch beyond the silicided RSD contacts 40B at least into the RSD 26, and possibly through the RSD 26 and the SOI layer 14 to stop at the BOX 12. This opens trenches 41 into the RSD structures 26 and possibly beyond (e.g., at least as far as the BOX 12). In this etching process the field dielectric layer 34 and the doped RSD 26 can be etched by RIE. Sputtering can be used to etch/remove the silicide. The RIE and sputtering steps can be carried out in separate chambers, although the RIE tool can be modified to have the sputtering capability.

FIGS. 12A and 12B, collectively referred to as FIG. 12, show the structure of FIG. 11 after a second silicide process wherein the metal is deposited through the apertures opened in FIG. 11 to contact at least the portions of the RSD Si exposed in the trenches 41, followed by the low temperature (for example, less than about 450° C.) anneal to silicide the deposited metal. The anneal process thus produces one of, for example, NiSi, PtSi or TiSi 40C within at least the RSD 26 (and possibly to a depth that terminates at the BOX 12 if present). After the second anneal the newly produced silicide 40C in the trenches 41 is electrically contiguous with the already deposited silicide 40B.

Figures 13A, 13B:
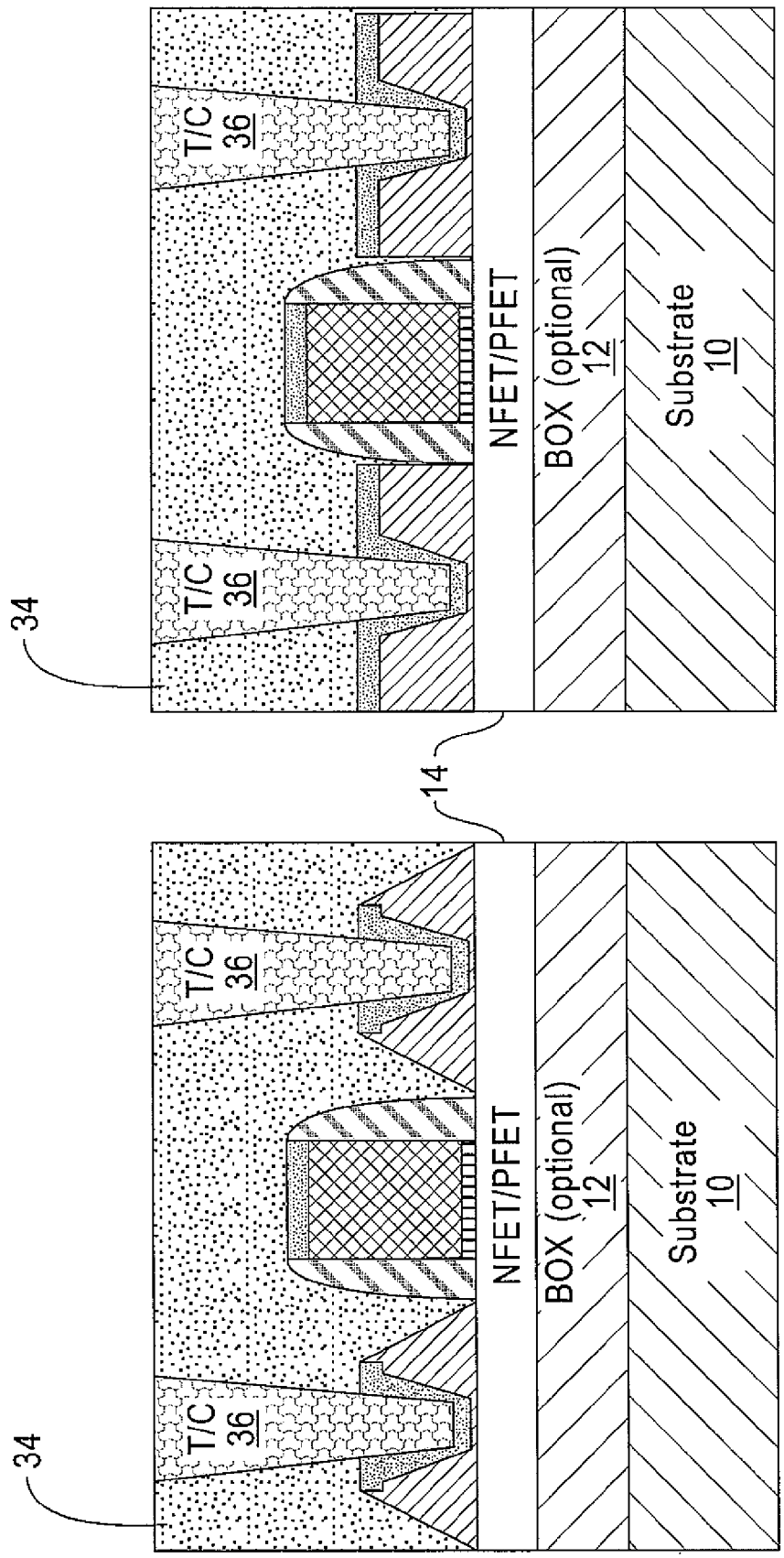
FIGS. 13A and 13B, collectively referred to as FIG. 13, show the structure of FIG. 12 after the deposition of the metal via having intrinsic stress, either tensile (T) or compressive (C), in the apertures and the silicided trenches.

FIGS. 13A and 13B, collectively referred to as FIG. 13, show the structure of FIG. 12 after the deposition of the metal via 36 having intrinsic stress, either tensile (T) or compressive (C), in the apertures 34A and the silicided trenches 41 so as to contact the silicide 40C. The result is the formation of either an NFET or a PFET having a channel in the SOI 14 between the RSD structures 26. As in the embodiment of FIGS. 1-9, the type of the intrinsic stress (TIC) is selected to have a polarity that enhances the channel strain, thereby enhancing the carrier mobility in the channel. As before, suitable contact metals to form the vias 36 include, for example, Tungsten, Copper or Aluminum.

The use of the silicided RSD trenches 41 provides a significantly greater metal via contact area, as compared to a case where the metal via 36 would contact just the silicided pads 40B atop the RSD 26 as in FIG. 10, thereby significantly reducing contact area resistance.

Embodiment 3

Figure 14B:
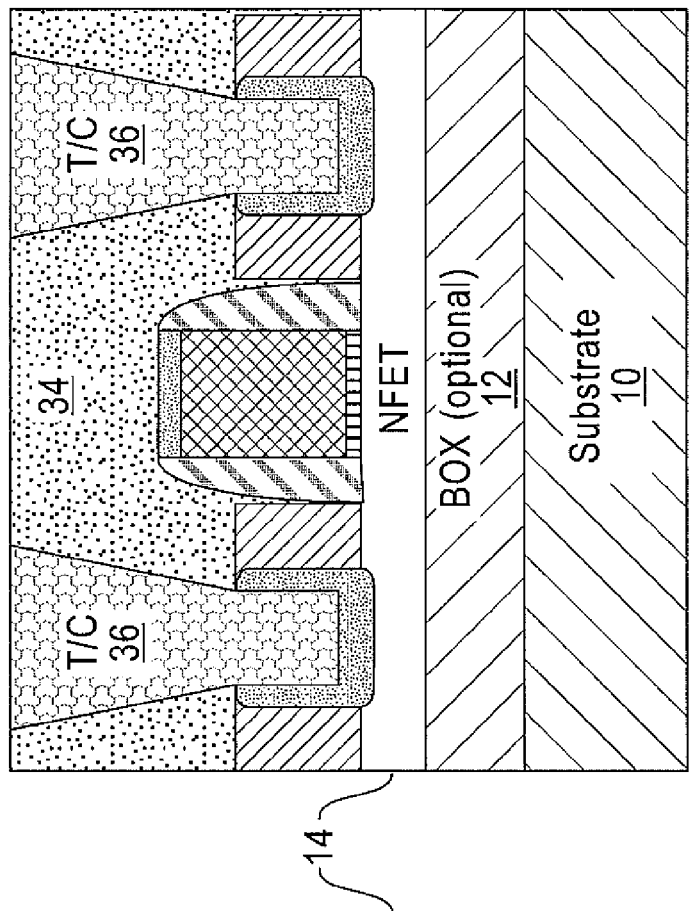
FIGS. 14A and 14B, collectively referred to as FIG. 14, show a third embodiment where the trench silicide is applied for just one polarity of device or alternatively where the trench silicide is applied only for logic FETS and not memory PETS (or vice versa), and further where the field dielectric can be applied to have intrinsic tensile or compressive stress, either in combination with metal vias having intrinsic stress, either tensile (T) or compressive (C), or with metal vias having no or little intrinsic stress.
Figure 14A:
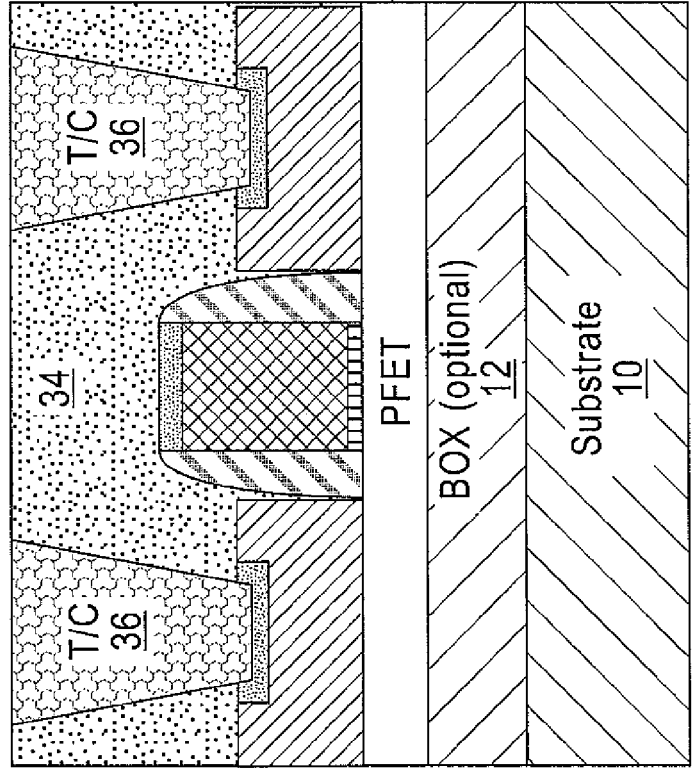

FIGS. 14A and 14B, collectively referred to as FIG. 14, show an embodiment where the trench silicide is applied for just one polarity of device, e.g., for the NFET device(s) as in FIG. 14B, and not for PFET devices as in FIG. 14A (or vice versa). Alternatively, the trench silicide can be applied only for logic FETS and not memory FETS (or vice versa). Alternatively, the trench silicide can be applied, as an example, only for PFET logic devices, or only for PFET memory devices, or only for NFET logic devices, or only for NFET memory devices.

In a still further embodiment, the field dielectric 34 (typically a nitride) can be applied to have intrinsic tensile or compressive stress, either in combination with metal vias 36 having intrinsic stress, either tensile (T) or compressive (C), or with metal vias 36 having no or little intrinsic stress. In general, for the case where the metal vias 36 have intrinsic stress then the intrinsic stress of the field dielectric 34 is selected to be the same type (tensile or compressive). Techniques to apply a field dielectric having intrinsic stress are well known in the art.

For example, a technique enables the creation of desired stress conditions within the channel region of different transistors by modifying the stress characteristics of a contact etch stop layer that is formed above the basic transistor structure in order to form contact openings to the gate and drain and source terminals in an interlayer dielectric material. The effective control of mechanical stress in the channel region, i.e., an effective stress engineering, may be accomplished by individually adjusting the internal stress in the contact etch stop layers located above the respective transistor elements so as to position a contact etch stop layer having an internal compressive stress above a P-channel transistor while positioning a contact etch stop layer having an internal tensile strain above an N-channel transistor, thereby creating compressive and tensile strain, respectively, in the respective channel regions.

The contact etch stop layer can be formed by plasma enhanced chemical vapor deposition (PECVD) processes above the transistor, i.e., above the gate structure and the drain and source regions. Silicon nitride may be used due to its high etch selectivity with respect to silicon dioxide, which is a well-established interlayer dielectric material. PECVD silicon nitride may be deposited with a high intrinsic stress, for example, up to 2 Giga Pascal (GPa) or significantly higher of tensile or compressive stress, wherein the type and the magnitude of the intrinsic stress may be efficiently adjusted by selecting appropriate deposition parameters. For example, ion bombardment, deposition pressure, substrate temperature, gas components and the like represent respective parameters that may be used for obtaining the desired intrinsic stress. The intrinsic stress can be efficiently transferred into the channel region, thereby significantly improving the performance thereof.

Embodiment 4

Figure 15B:
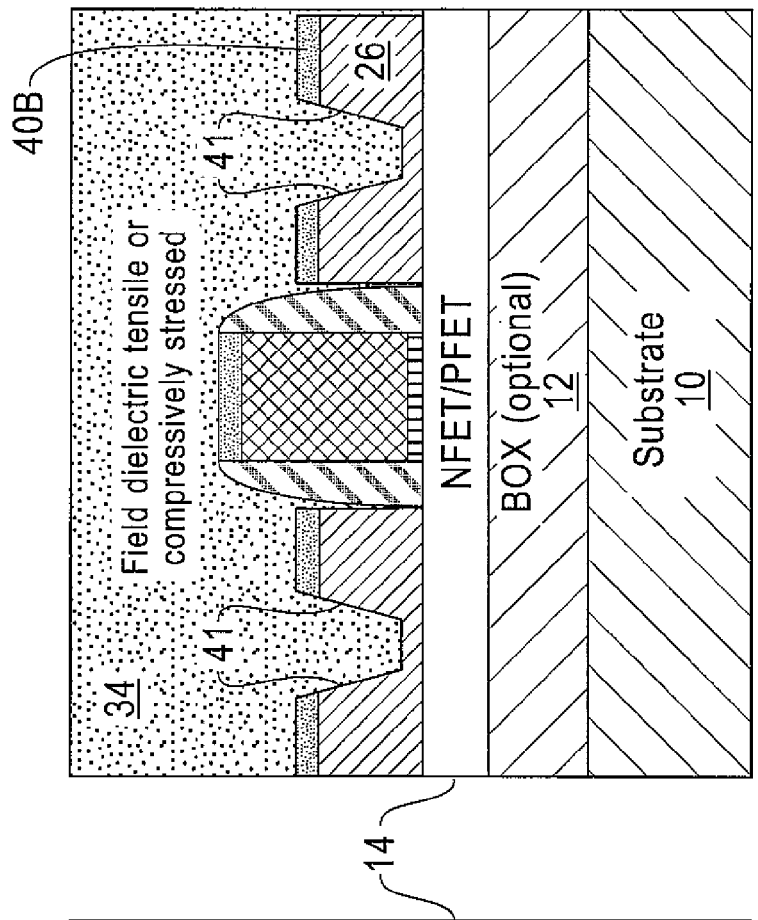
FIGS. 15A and 15B, collectively referred to as FIG. 15, show a fourth embodiment where the contact field dielectric is stressed (tensile or compressive) and fills the RSD trench (as in FIG. 11) at locations away from where the contact metal (stud) makes contact to the silicided trench and applies stress to the channel.
Figure 15A:
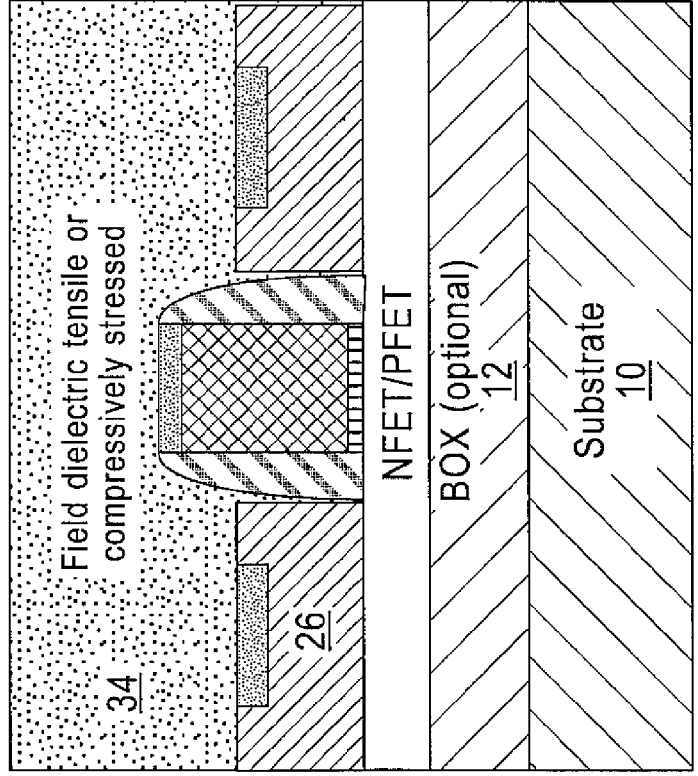

FIGS. 15A and 15B, collectively referred to as FIG. 15, show an embodiment where the contact field dielectric 34 is stressed (tensile or compressive). In a contact stud embodiment, as opposed to the contact bar embodiment mentioned above, and as is particularly shown in FIG. 15B, the field dielectric will fill the RSD trench 41 (e.g. see FIG. 11) at locations away from where the contact metal (stud) 36 makes contact to the silicided trench (e.g., as in FIG. 14B) and applies stress to the channel.

It is to be understood that although the exemplary embodiments discussed above with reference to FIGS. 1-15 can be used on common variants of the FET device including, e.g., FET devices with multi-fingered FIN and/or gate structures, FET devices of varying gate width and length, as well as ring oscillator devices.

Integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention, and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, metals, silicides, insulators, dielectrics, dopants, dopant concentrations, layer thicknesses and the like that were specifically disclosed above. Any and all such and similar modifications of the teachings of this invention will still fall within the scope of this invention.

What is claimed is:

1. A structure comprising:
   at least one field effect transistor having a gate stack disposed between raised source drain structures that are adjacent to the gate stack, the gate stack and raised source drain structures being disposed on a surface of a semiconductor material, where the surface of the semiconductor material is a surface of a silicon-on-insulator layer disposed over a layer of buried oxide;
   a layer of field dielectric overlying the gate stack and raised source drain structures; and
   first contact metal and second contact metal extending through the layer of field dielectric, the first contact metal terminating in a first trench formed through a top surface of a first raised source drain structure, the second contact metal terminating in a second trench formed through a top surface of a second raised source drain structure, each trench comprising silicide formed on sidewalls and a bottom surface of at least a portion of the trench, where
   the bottom surface of each trench extends at least to the layer of buried oxide.

2. The structure of claim 1, where the contact metal is comprised of a metal selected to exhibit one of tensile stress or compressive stress; and where the layer of field dielectric is comprised of a material selected to exhibit tensile stress when the selected contact metal exhibits tensile stress, and where the layer of field dielectric is comprised of a material selected to exhibit compressive stress when the contact metal exhibits compressive stress.

3. The structure of claim 1, where the at least one field effect transistor is one of a logic field effect transistor or a memory field effect transistor.

4. The structure of claim 1, where the raised source drain structures are in-situ doped raised source drain structures having faceted edges.

5. The structure of claim 1, where the raised source drain structures are in-situ doped raised source drain structures having non-faceted edges.

6. The structure of claim 1, further comprising silicide disposed on a gate conductor.

7. The structure of claim 1, where the silicide is comprised of one of nickel silicide, platinum silicide and titanium silicide.

\* \* \* \* \*